United States Patent
Jafri et al.

(10) Patent No.: US 7,407,826 B2
(45) Date of Patent: Aug. 5, 2008

(54) VACUUM PACKAGED SINGLE CRYSTAL SILICON DEVICE

(75) Inventors: Ijaz H. Jafri, Woodinville, WA (US); Galen P. Magendanz, Issaquah, WA (US)

(73) Assignee: Honeywell International Inc., Morristown, NJ (US)

(*) Notice: Subject to any disclaimer, the term of this patent is extended or adjusted under 35 U.S.C. 154(b) by 229 days.

(21) Appl. No.: 11/322,842

(22) Filed: Dec. 30, 2005

(65) Prior Publication Data

US 2006/0211169 A1  Sep. 21, 2006

Related U.S. Application Data

(63) Continuation-in-part of application No. 11/084,978, filed on Mar. 21, 2005.

(51) Int. Cl.
*H01L 21/00* (2006.01)
(52) U.S. Cl. .................. 438/48; 438/14; 438/400; 257/E27.112
(58) Field of Classification Search ............ 438/48
See application file for complete search history.

(56) References Cited

U.S. PATENT DOCUMENTS

| 6,249,073 | B1 | 6/2001 | Nguyen et al. |
| 6,424,074 | B2 | 7/2002 | Nguyen et al. |
| 6,433,401 | B1* | 8/2002 | Clark et al. .......... 257/524 |
| 6,490,147 | B2 | 12/2002 | Yoon et al. |
| 6,566,786 | B2 | 5/2003 | Nguyen |
| 6,569,754 | B2 | 5/2003 | Wong et al. |
| 6,577,040 | B2 | 6/2003 | Nguyen |
| 6,593,831 | B2 | 7/2003 | Nguyen |
| 6,600,252 | B2 | 7/2003 | Nguyen |
| 6,628,177 | B2 | 9/2003 | Clark et al. |
| 6,667,558 | B2 | 12/2003 | Wong et al. |
| 6,680,660 | B2 | 1/2004 | Nguyen |
| 6,713,938 | B2 | 3/2004 | Nguyen |
| 6,739,190 | B2 | 5/2004 | Hsu et al. |
| 7,202,560 | B2* | 4/2007 | Dungan et al. .............. 257/713 |
| 2005/0037534 | A1* | 2/2005 | Sawyer .................. 438/84 |

* cited by examiner

*Primary Examiner*—Walter Lindsay, Jr.
*Assistant Examiner*—Abdulfattah Mustapha
(74) *Attorney, Agent, or Firm*—Black Lowe & Graham PLLC

(57) ABSTRACT

A method for forming a vibrating micromechanical structure having a single crystal silicon (SCS) micromechanical resonator formed using a two-wafer process, including either a Silicon-on-insulator (SOI) or insulating base and resonator wafers, wherein resonator anchors, capacitive air gap, isolation trenches, and alignment marks are micromachined in an active layer of the base wafer; the active layer of the resonator wafer is bonded directly to the active layer of the base wafer; the handle and dielectric layers of the resonator wafer are removed; windows are opened in the active layer of the resonator wafer; masking the active layer of the resonator wafer with photoresist; a SCS resonator is machined in the active layer of the resonator wafer using silicon dry etch micromachining technology; and the photoresist is subsequently dry stripped. A patterned SCS cover is bonded to the resonator wafer resulting in hermetically sealed chip scale wafer level vacuum packaged devices.

9 Claims, 10 Drawing Sheets

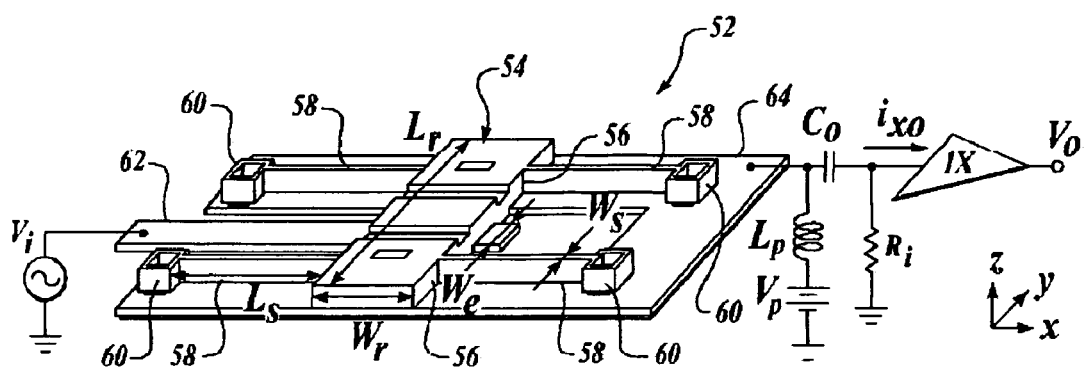
FIG. 4  *(PRIOR ART)*
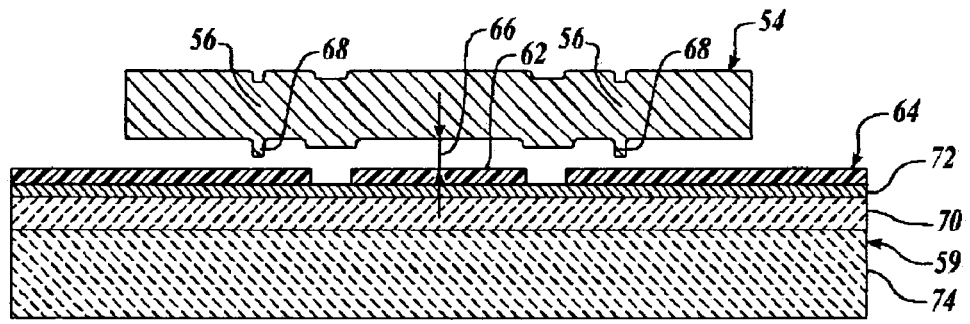
FIG. 5A  *(PRIOR ART)*
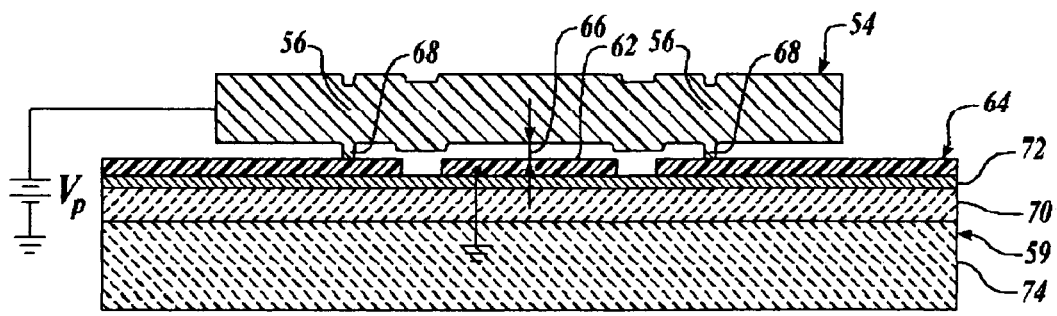
FIG. 5B  *(PRIOR ART)*

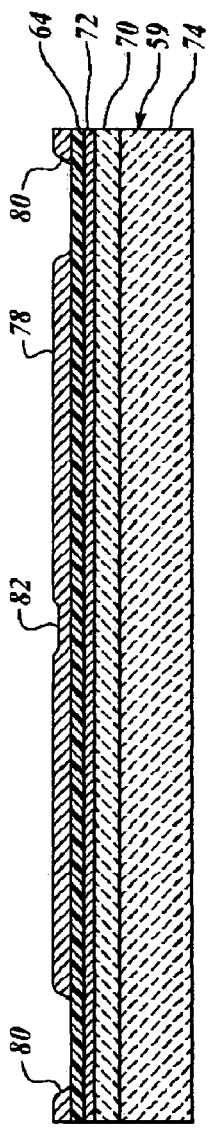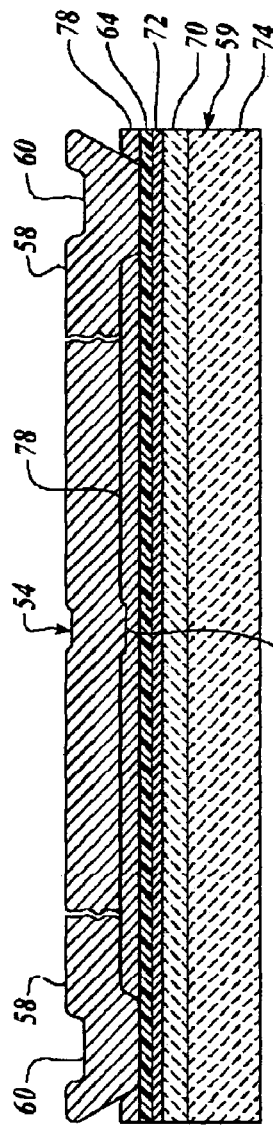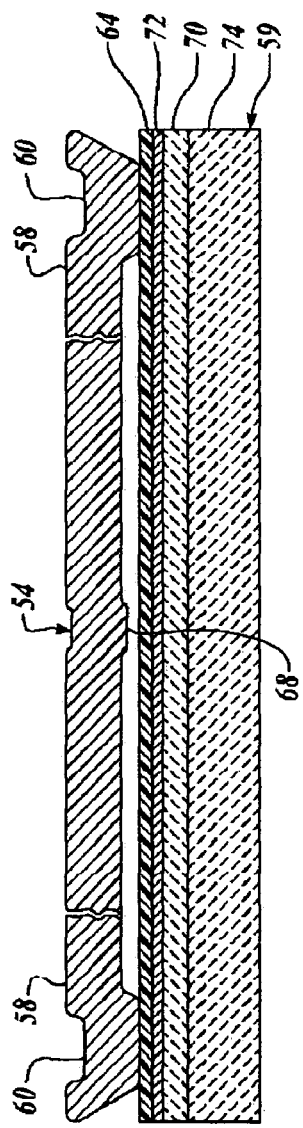
FIG. 6A (PRIOR ART)
FIG. 6B (PRIOR ART)
FIG. 6C (PRIOR ART)

VACUUM PACKAGED SINGLE CRYSTAL SILICON DEVICE

This application is a Continuation-in-part and claims benefit of co-pending U.S. patent application Ser. No. 11/084,978 filed in the names of Ijaz H. Jafri, Jonathan L. Klein and Galen P. Magendanz, all U.S. Citizens, on Mar. 21, 2005, the complete disclosure of which is incorporated herein by reference and in substance.

FIELD OF THE INVENTION

The present invention relates to methods of fabricating micromechanical resonators using Silicon-on-insulator (SOI) wafers, and in particular to methods of fabricating micromechanical resonators using single crystal silicon wafer material.

BACKGROUND OF THE INVENTION

As disclosed by Yoon, et al. in U.S. Pat. No. 6,490,147, "High-Q Micromechanical Device and Method of Tuning Same," Dec. 3, 2002, which is incorporated herein by reference, and also by Nguyen, et al. in U.S. Pat. No. 6,249,073, "Device Including a Micromechanical Resonator Having an Operating Frequency and Method of Extending Same," Jun. 19, 2001, which is incorporated herein by reference, vibrating micromechanical resonators formed of polycrystalline silicon, commonly known as polysilicon, are well-known as miniaturized substitutes for crystals in a variety of high-Q oscillator and filtering applications. State of the art micromechanical resonator fabrication techniques utilize polycrystalline silicon for manufacturing micromechanical resonators devices produced by means of silicon sacrificial surface micromachining.

This state of the art method of manufacturing using sacrificial surface micromachining produces polysilicon resonators or other thin film resonators having intrinsic stresses, stress gradients, or both, that effect device performance. These intrinsic stresses and stress gradients are difficult to control during manufacturing. Yet, control of these intrinsic stresses and stress gradients is critical for devices for use in applications that require high repeatability and reproducibility.

This state of the art method of manufacturing using polysilicon also requires removal of a sacrificial layer of material using wet etching techniques that complicate the manufacturing process and generally results in low yield due to difficulty in removing sacrificial material in the small gap between the resonator and the lower electrode. This method of manufacturing using polycrystalline silicon also results in stiction, which further lowers yields.

For devices requiring very small capacitive air gaps, e.g., to compensate for manufacturing tolerances or for tuning or for use as tunable resonator cum filter, the removal of sacrificial layer becomes extremely difficult as liquid or even vapor etching techniques cannot easily penetrate underneath the resonators to create a free standing structures. The removal of etched sacrificial material to form the capacitive gap is a process as well as operation yield limiter for small air gaps on the order of 300 Angstrom or smaller.

Additionally, impurities present in polysilicon thin films degrade device performance and also result in lower resonator Q.

FIGS. 1 and 2 present conceptual and perspective view schematics, respectively, of a tunable capacitor 10 as taught by Yoon, et. al. in U.S. Pat. No. 6,490,147. The capacitor 10 has a bottom capacitor plate 12 fixed to a substrate 14, and a top capacitor plate 16 suspended above the bottom plate 12. The top capacitor plate 16 is also anchored to the substrate 14. Both plates 12 and 16 are constructed of copper (Cu) to minimize their total series resistance in an attempt to maximize the device quality factor, Q.

A dielectric slab 18 is suspended between the two plates 12 and 16 and anchored to the substrate 14 outside the two plates 12 and 16 via spring structures 20. This dielectric 18 is free to move by electrostatic displacement to alter either the overlap between it and the capacitor plates 12 and 16, or the fringing fields between them. In the former case, when a DC bias is applied between the two plates 12 and 16, the charges on the capacitor plates 12 and 16 exert an electrostatic force on the induced charges in the dielectric 18 to pull the dielectric 18 into the gap between the plates 12 and 16, as shown in FIG. 1. The "waffle" shape of the capacitor 10 shown in FIG. 2 is intended to minimize the travel distance, or the needed voltage, required for a given change in capacitance, and to provide etchant access paths during a step in the fabrication process for removing a thin sacrificial layer by etching.

FIGS. 3A-3E are side sectional views which illustrate one state of the art fabrication process for producing micromechanical resonators of the type depicted by the capacitor 10. The prior art process, as taught by Yoon, et. al. in U.S. Pat. No. 6,490,147, begins in FIG. 3A with the thermal growth of a 1 micron layer 30 of $SiO_2$ to serve as an isolation or dielectric layer between the eventual metal structures and a silicon wafer or substrate 32. Next, the bottom capacitor plate 12 is formed by first evaporating 300 Angstroms/2000 Angstroms a Cr/Cu seed layer 34, then electroplating a 5 micron layer 36 of copper (Cu). A 3000 Angstrom layer 38 of nickel (Ni) is then electroplated above the Cu layer 36 to serve as a buffer layer to prevent Cu contamination of etch chambers during subsequent reactive ion etch (RIE) processes.

FIG. 3B illustrates a first 2000 Angstrom aluminum (Al) sacrificial layer 40 is evaporated and patterned to form vias through which a subsequent layer PECVD nitride dielectric film 42 adheres to the underlying Ni layer 38. The nitride film 42 is patterned via RIE to form the movable dielectric plate 18, then submerged under 0.9 micron of a second sacrificial Al film 44 that defines the spacing between the dielectric plate 18 and the eventual top metal plate 16, as shown in FIG. 3C. Due to the valley-like topography between the fingers of the etched dielectric, the deposition of the 0.9 micron layer 44 of Al actually results in only a 0.3 micron gap between the top plate 16 and the dielectric 18 when the two are engaged.

After etching vias through the Al layer 44 to define top plate anchors (shown in FIG. 3C), as shown in FIG. 3D, the top plate 16 is formed by first evaporating a thin Cr/Cu seed layer 46, then electroplating a Cu layer 48 through a defining photoresist mold 50 to a thickness sufficient to insure that the top plate 16 does not bend under applied actuation voltages. The PR and seed layer under the PR are removed. The two Al sacrificial layers 40 and 44 are selectively etched to release the dielectric 42 using a $K_3Fe(CN)_6$/NaOH solution, which attacks Al, but leaves Cu and the nitride dielectric 42 intact, yielding the final cross-section shown in FIG. 3E. After release, sublimation or a critical point dryer is often used to dry the capacitor 10 in an attempt to prevent stiction.

Additionally, cleaning and removal of the sacrificial layer is extremely difficult for small gaps, and often requires use of a surfactant.

FIG. 4 illustrates a perspective view schematic of a free-free beam, flexural-mode, micromechanical device or resonator 52 and an electrical pick off scheme, as taught by Nguyen, et. al. in U.S. Pat. No. 6,249,073. The device 52 includes a free-free micromechanical flexural resonator beam 54 supported at its flexural nodal points 56 by four torsional beams 58, each anchored to a substrate 59 by rigid contact anchors 60. A drive electrode 62 underneath the free-free resonator beam 54 allows electrostatic excitation via an applied AC voltage Vi, and output currents are detected directly off a DC-biased (via $V_P$) resonator structure 64. The torsional support beams 58 are designed with quarter-wavelength dimensions, which effect an impedance transformation that isolates the free-free resonator beam 54 from the rigid anchors 60. Ideally, the free-free resonator beam 54 sees zero-impedance into its supports or beams 58, and thus, effectively operates as if levitated without any supports. As a result, anchor dissipation mechanisms normally found in previous clamped-clamped beam resonators are greatly suppressed, allowing much higher device Q. However, multiple drive electrodes may be utilized for push-pull excitation. The electrodes can also be used for sensing, frequency tuning and detection of the output.

Typically, a transducer capacitor gap spacing is entirely determined via a sacrificial surface micromachining process for removing a thin sacrificial oxide layer, and wet etching of the sacrificial layer for final release of the flexural resonator beam 54 to create the capacitor gap.

FIGS. 5A and 5B illustrate a transducer capacitor gap spacing, as taught by Nguyen, et al. in U.S. Pat. No. 6,249,073, that is not entirely determined via a thin sacrificial oxide, as was done (with difficulty) in previous clamped-clamped beam high frequency devices. Rather, as taught by Nguyen, et al., the capacitor gap 66 is determined by the height of spacers or dimples 68 set by a timed etch. The height of the dimples 68 is such that when a sufficiently large DC-bias $V_P$ is applied between the drive electrode 62 and the resonator beam 54, the whole structure comes down and rests upon the dimples 68, which are located at the flexural nodal points 56. The spacers 68 are formed either on the resonator beam 54 or on the substrate 59.

As taught by Nguyen, et al. in U.S. Pat. No. 6,249,073, the use of dimples to set the capacitor gap spacings 66 is intended to permit much thicker sacrificial oxide spacers to be used, thereby alleviating previous problems due to pinholes and non-uniformity in ultra-thin sacrificial layers used when transducer capacitor gap spacing is entirely determined by sacrificial surface micromachining for removing the thin sacrificial oxide. Also, the thicker sacrificial oxide is intended to be easier to remove than previous thinner ones, which is intended to decrease the required HF release etch time and lessen the probability that etching by-products remain in the gap 66 where they might interfere with resonator operation and Q.

FIGS. 6A, 6B and 6C illustrate one state of the art fabrication method for producing micromechanical resonators as taught by Nguyen, et al. in U.S. Pat. No. 6,249,073, wherein the device 52 is fabricated using a five-mask, polycrystalline silicon or "polysilicon," surface-micromachining technology described by the process flow shown in U.S. Pat. No. 6,249,073. The fabrication sequence taught by Nguyen, et al. begins with isolation layers 70 and 72 formed via successive growth and deposition of 2 micron thermal oxide and 2000 Angstrom LPCVD $Si_3N_4$, respectively, over a <100> lightly-doped p-type starting silicon wafer 74. Next, 3000 Angstroms of LPCVD polysilicon is deposited at 585 degrees C. and phosphorous-doped via implantation, then patterned to form the ground planes 64 and interconnects. An LPCVD sacrificial oxide layer 78 is then deposited to a mathematically determined thickness, after which successive masking steps produce dimple and anchor openings 80, 82. The dimple openings 82 are defined via a reactive-ion etch which must be precisely controlled. Anchors openings 80 are simply wet-etched in a solution of buffered hydrofluoric acid (BHF).

Next, in FIG. 6B, structural polysilicon is deposited via LPCVD at 585 degrees C. and phosphorous dopants are introduced via ion-implantation to provide the flexural resonator beam 54. A 2000 Angstrom-thick oxide mask is then deposited via LPCVD at 900 degrees C., after which the wafers must be annealed for one hour at 1000 degrees C. in an effort to relieve stress and distribute dopants.

As illustrated in FIG. 6C, wet etching of the sacrificial layer is used for final release of the flexural resonator beam 54 to create the capacitor gap 66. Both the oxide mask and structural layer are patterned via $SF_6/O_2$ and $Cl_2$-based RIE etches, respectively. The structures 54 and 58 are then released via a 5 minute etch in 48.8 wt. % HF. As taught by Nguyen, et al. in U.S. Pat. No. 6,249,073, this 5 minute release etch time is significantly shorter than that required for previous clamped-clamped beam resonators, which is about 1 hour, because they did not benefit from the dimple-activated gap spacings, as taught by Nguyen, et al. The previous clamped-clamped beam resonators require sacrificial oxide thicknesses on the order of hundreds of Angstroms. After structural release by wet etching of the sacrificial layer, aluminum is evaporated and patterned over polysilicon interconnects via lift-off to reduce series resistance.

Thus, state of the art methods of manufacturing using polycrystalline silicon produces resonators having intrinsic stresses, stress gradients, or both, that effect device performance. These state of the art methods of manufacturing using polycrystalline silicon also require removal of a sacrificial layer of material using wet etching techniques that complicate the manufacturing process and generally results in low yield due to difficulty in removing sacrificial material in the small gap between the resonator and the lower electrode. This method of manufacturing using polycrystalline silicon also results in stiction, which further lowers yields, and impurities present in polysilicon thin films degrade device performance and result in lower resonator Q.

Thus, an improved device and method of manufacturing are desirable.

SUMMARY OF THE INVENTION

A method for fabrication of single crystal silicon (SCS) micromechanical resonators using a two-wafer process, including a Silicon-on-Insulator (SOI) or an insulating base wafer and a SOI resonator wafer, wherein resonator anchors, a capacitive air gap, isolation trenches, transmission lines, and alignment marks are micromachined in a single crystal silicon semiconductor material active layer of the base SOI wafer. When practiced using an insulating wafer, such as glass, Pyrex, quartz, or oxidized silicon, alignment marks, capacitive air gap, transmission lines, and resonator anchors are fabricated on the insulating wafer using a combination of bulk and surface micromachining and metal deposition and etching. The single crystal silicon semiconductor material active layer of the resonator wafer is bonded directly to the active layer of the base wafer using wafer flat for alignment. The handle and dielectric layers of the resonator wafer are removed. According to one aspect of the invention, viewing windows are opened in the active layer of the resonator wafer to access alignment marks in the active layer of base wafer. Alternatively, alignment is accomplished using a conventional double sided aligner. The SCS semiconductor material active layer of the resonator wafer is masked with photoresist material; and a single crystal silicon resonator is fabricated in the single crystal silicon semiconductor material active layer of the resonator wafer using silicon dry etch micromachining technology, such as reactive ion etching (RIE) or deep reactive ion etching (DRIE). The photoresist material is subsequently removed by dry stripping.

According to one aspect of the invention, alignment for bonding the single crystal silicon (SCS) semiconductor material active layer of the resonator wafer with base wafer is accomplished using only wafer flat alignment of the two or more stacked wafers.

According to another aspect of the invention, alignment for bonding the single crystal silicon (SCS) semiconductor material active layer of the resonator wafer with the base wafer is accomplished using double sided aligner.

According to another aspect of the invention, the resonator beam anchors, capacitive air gap, transmission lines, isolation trenches, and alignment marks are machined in the active layer of the base SOI wafer further using a conventional photolithography masking and dry etching micromachining method.

According to yet another aspect of the invention, the resonator beam anchors, capacitive air gap, transmission lines, isolation trenches, and alignment marks are machined on an insulating substrate, such as Pyrex, glass, quartz, oxidized silicon, or nitride, using etching of the insulating layer and metal deposition to create these features.

According to another aspect of the invention, the two wafers are bonded by fusion bonding, anodic bonding or frit bonding methods.

According to another aspect of the invention, silicon dry etch machining the single crystal silicon resonator beam in the single crystal silicon semiconductor material active layer of the resonator wafer produces a single crystal silicon clamped-clamped resonator beam.

According to another aspect of the invention, silicon dry etch machining the single crystal silicon resonator beam in the single crystal silicon semiconductor material active layer of the resonator wafer produces a single crystal silicon clamped-free resonator beam.

According to another aspect of the invention, silicon dry etch machining the single crystal silicon resonator beam in the single crystal silicon semiconductor material active layer of the resonator wafer produces a single crystal silicon free-free resonator beam.

According to another aspect of the invention, silicon dry etch machining the single crystal silicon resonator beam in the single crystal silicon semiconductor material active layer of the resonator wafer produces a single crystal silicon membrane or disk.

According to another aspect of the invention, the single crystal silicon clamped-clamped resonator beam is an interconnected dual resonator that is structured to form a filter device.

According to one aspect of the invention, the single crystal silicon wafer mechanical resonator is structured as a clamped-clamped interconnected dual beam resonator for operation as filter.

According to one aspect of the invention, the single crystal silicon wafer mechanical resonator is structured as a clamped-free interconnected dual beam resonator for operation as filter.

According to one aspect of the invention, the single crystal silicon wafer mechanical resonator is structured as a free-free interconnected dual beam resonator for operation as filter.

According to one aspect of the invention, the single crystal silicon wafer mechanical resonator is structured as a one disk or multidisk interconnected resonator for operation as filter.

According to other aspects of the invention, an improved micromechanical resonator structured of single crystal silicon wafer material is provided using the method of the present invention.

According to yet another aspect of the invention, a method is provided for forming a hermetically sealed vibrating micromechanical structure using the vibrating micromechanical structure of the invention, the method including, in a single crystal silicon semiconductor material cover wafer having substantially planar and spaced apart top and bottom surfaces, forming a cover by etching a plurality of access holes through the cover wafer between the spaced apart top and bottom cover wafer surfaces; etching a pattern of frit trenches in the cover wafer bottom surface, the pattern including one or more frit trenches surrounding each of the access holes and one or more frit trenches completely surrounding an interior area of the wafer bottom surface; oxidizing the top and bottom cover surfaces; screen printing frit bonding material in the frit trenches; in a chamber enclosing a vacuum or other controlled atmosphere, frit bonding the cover with a micromechanical resonator device of the invention, the micromechanical resonator device having a resonator etched in a single crystal silicon semiconductor material active layer of a Silicon-On-Insulator resonator wafer and further comprising a base wafer coupled to the single crystal silicon resonator, with the cover being joined to the active layer of the resonator wafer with the one or more flit trenches that surround the interior area of the wafer bottom surface being positioned to completely surround the resonator, and with the access holes being aligned with contact pads formed on the active layer of the resonator wafer.

According to another aspect of the invention, the method also includes, in the interior area of the wafer bottom surface, etching a clearance recess corresponding to the device resonator. Additionally, the method of the invention optionally includes depositing a "getter" material within the device, for example, in the clearance recess.

According to another aspect of the invention, the method also includes etching electrically conductive paths through an oxidation layer formed by the oxidizing in the top and bottom cover surfaces.

According to another aspect of the invention, the method also includes, in one or more of the access holes, forming an electrically conductive path between the corresponding contact pad on the resonator wafer and a contact pad formed on the top surface of the cover wafer.

According to another aspect of the invention the electrically conductive path between the contact pad on resonator wafer and contact pad formed on the top surface of cover wafer can be formed be depositing metal such as gold or aluminum through an aperture mask or stencil mask.

According to another aspect of the invention the cover wafer may be thinned to a desired thickness to provide an electrically conductive path between the contact pad on resonator wafer by direct wire bonding.

According to another aspect of the invention, the method also includes, after frit bonding of cover with a micromechanical resonator device, dicing the resonator device and cover wafer as a packaged and hermetically sealed micromechanical resonator device.

These and other features and advantages of the invention will appear from the following description in which the preferred embodiment has been set forth in detail in conjunction with the accompanying drawings.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4 illustrates a perspective view schematic of a state of the art free-free beam, flexural-mode, micromechanical device or resonator and an electrical pick off scheme, as taught by Nguyen, et al. in U.S. Pat. No. 6,249,073;

FIGS. 5A and 5B illustrate a state of the art transducer capacitor gap spacing, as taught by Nguyen, et al. in U.S. Pat. No. 6,249,073;

FIGS. 6A, 6B and 6C illustrate one state of the art fabrication method using a five-mask, polysilicon, surface-micromachining technology described by the process flow, as taught by Nguyen, et al. in U.S. Pat. No. 6,249,073;

DETAILED DESCRIPTION OF PREFERRED EMBODIMENT

In the Figures, like numerals indicate like elements.

The present invention is an apparatus and method for fabrication of micromechanical resonators using a two-wafer process, including a Silicon-on-Insulator (SOI) base wafer and a SOI resonator wafer, or alternatively an insulating base wafer and a single crystal silicon (SCS) or SOI resonator wafer.

Figure 1:
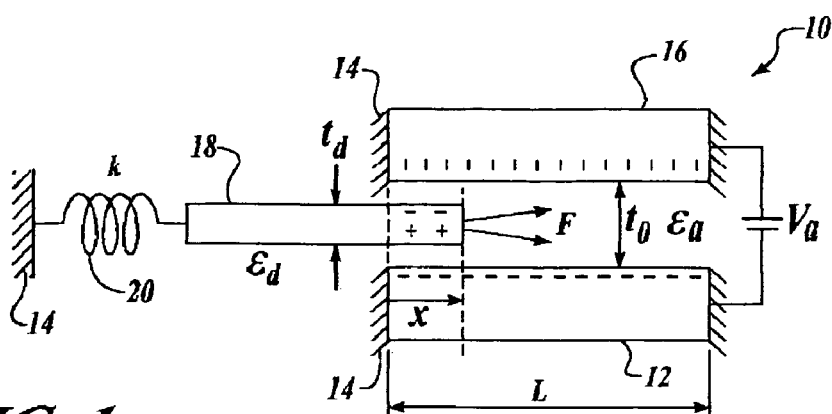
FIGS. 1 and 2 present conceptual and perspective view schematics, respectively, of a state of the art tunable capacitor as taught by Yoon, et. al. in U.S. Pat. No. 6,490,147.
Figure 2:
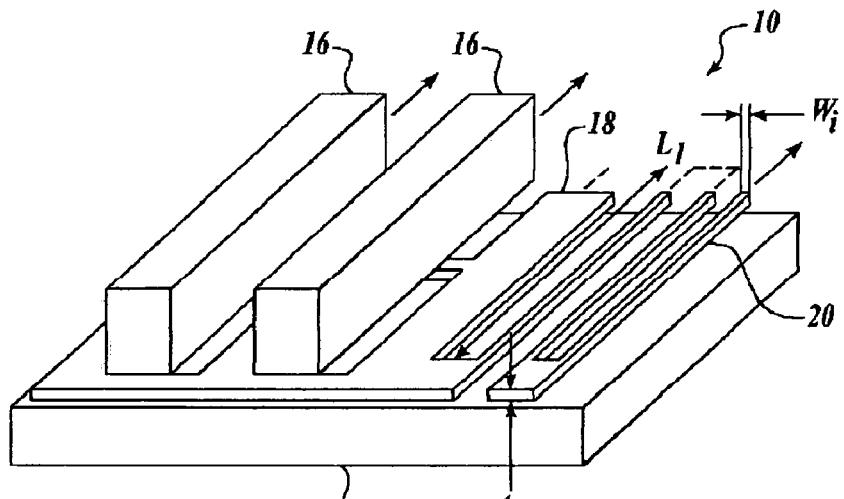
Figure 3A:
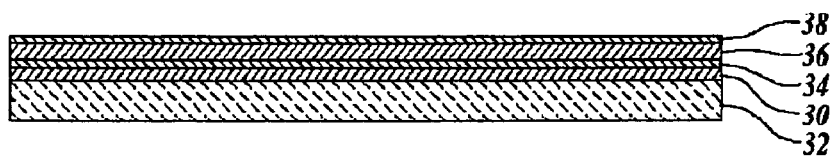
FIGS. 3A-3E are side sectional views which illustrate one state of the art fabrication process of the prior art used for the capacitor illustrated in FIGS. 1 and 2, as taught Yoon, et. al. in U.S. Pat. No. 6,490,147.
Figure 3B:
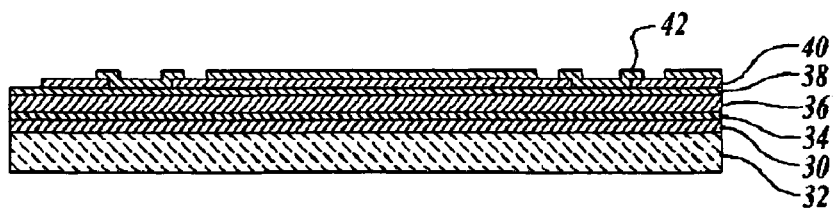
Figure 3C:
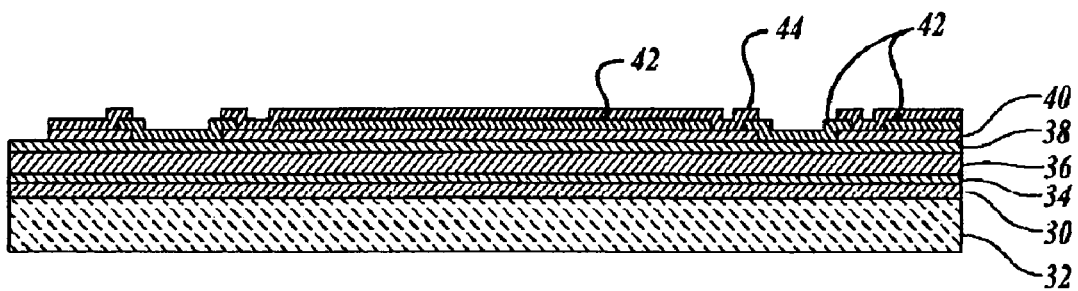
Figure 3D:
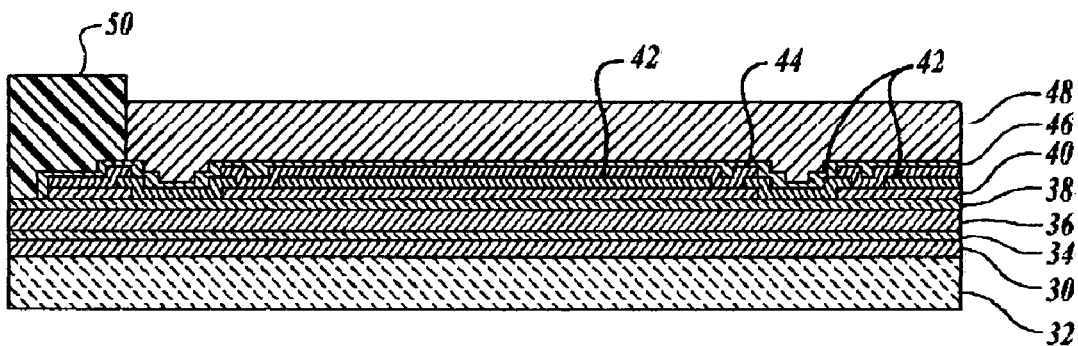
Figure 3E:
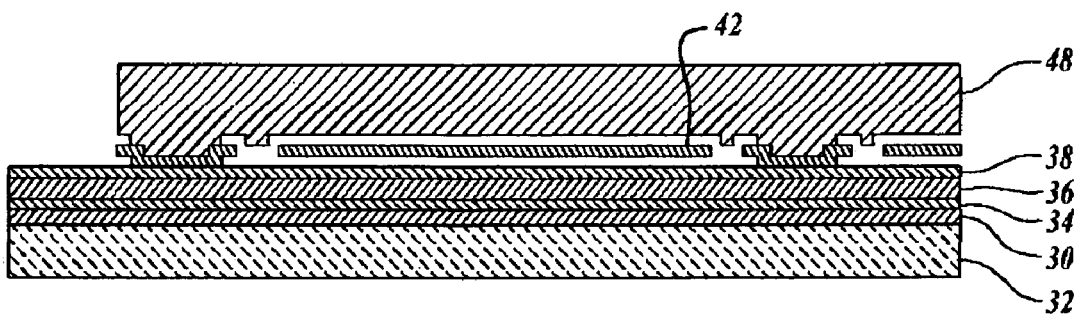
Figure 7:
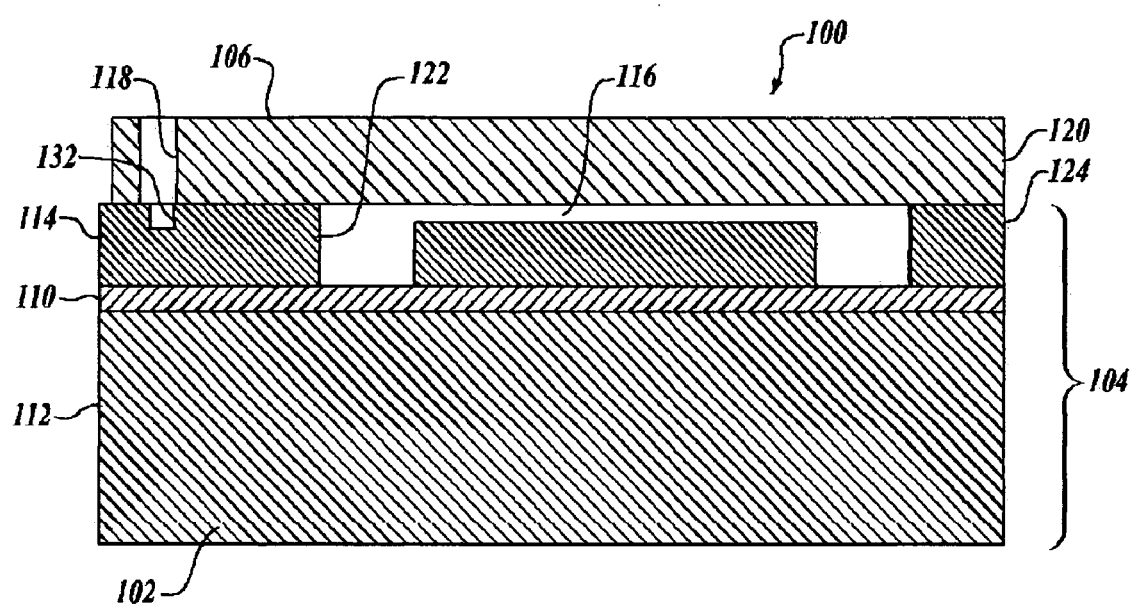
FIG. 7 is a cross-sectional view that illustrates the architecture of a micromechanical resonator device of the present invention formed of two bonded Silicon-on-insulator (SOI) wafer elements.

FIG. 7 is a cross-sectional view that illustrates the architecture of a micromechanical resonator device 100 of the present invention formed of a SOI base plate 102 formed in a SOI base wafer 104 and a single crystal silicon micromechanical resonator 106 formed in a SOI resonator wafer 108 (shown in subsequent Figures and described below). The SOI base and resonator wafers are a type that is generally commercially available. The SOI base wafer element 104 includes a buried dielectric layer 110 having a typical thickness of from about 0.5 to 2.0 microns that is sandwiched between relatively thicker "handle" and "active" layers 112, 114 both of single crystal silicon (SCS) semiconductor material.

The resonator 106 is positioned above a capacitive air gap 116 in which the resonator 106 moves out of plane. The single crystal silicon resonator 106 is direct or fusion bonded at either end 118, 120 directly to single crystal silicon anchors 122, 124 formed in the active layer 114 of the base wafer 104, whereby it is coupled to the base plate 102 at both ends to provide a resonator of the clamped-clamped type. As was known in the prior art, such clamped-clamped type resonators achieve both small mass and high stiffness with relative ease. This is paramount for communications-grade resonators, since stiffness directly influences the dynamic range of circuits utilizing such resonators.

According to one embodiment of the invention, when the base wafer 104 is a SOI wafer, the resonator 106 is direct or fusion bonded to the SCS anchors 122, 124. Alternatively, the resonator 106 is frit bonded to the SCS anchors 122, 124 of the SOI base wafer 104.

According to another embodiment of the invention, when the base wafer 104 is an insulating substrate of the type described herein, the resonator 106 is anodic or frit bonded to the anchors 122, 124.

Single crystal silicon (SCS) semiconductor material for resonator 106 is a superior structural material for microresonators compared to polycrystalline films such as polysilicon and others due to lower internal friction and consequently higher mechanical Q, lower internal stress and an independence from various process parameters exhibited by polycrystalline silicon semiconductor material.

Figure 8:
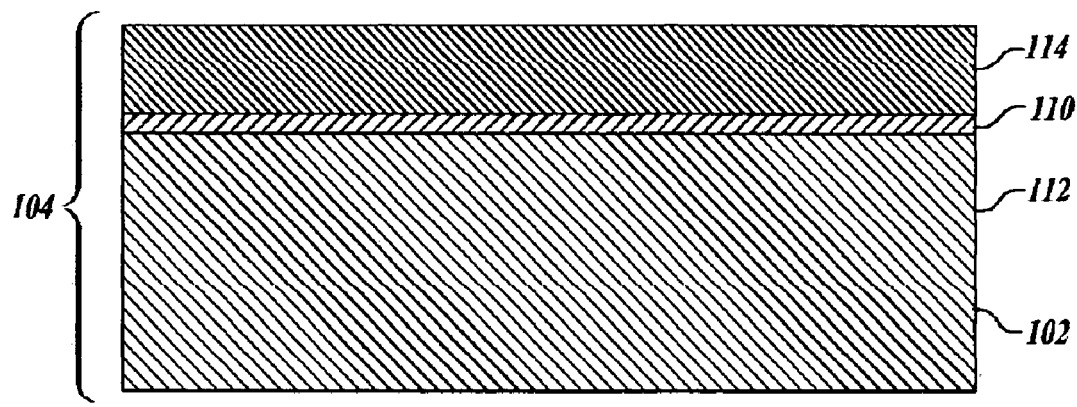
FIG. 8 is a cross-sectional view of a SOI base wafer element having a buried dielectric layer sandwiched between relatively thicker semiconductor material handle and thinner active layers.

FIG. 8 is a cross-sectional view of the SOI base wafer 104 having the buried dielectric layer 110 sandwiched between relatively thicker SCS semiconductor material handle and active layers 112, 114 whereof the SOI base plate 102 is formed.

Figure 9:
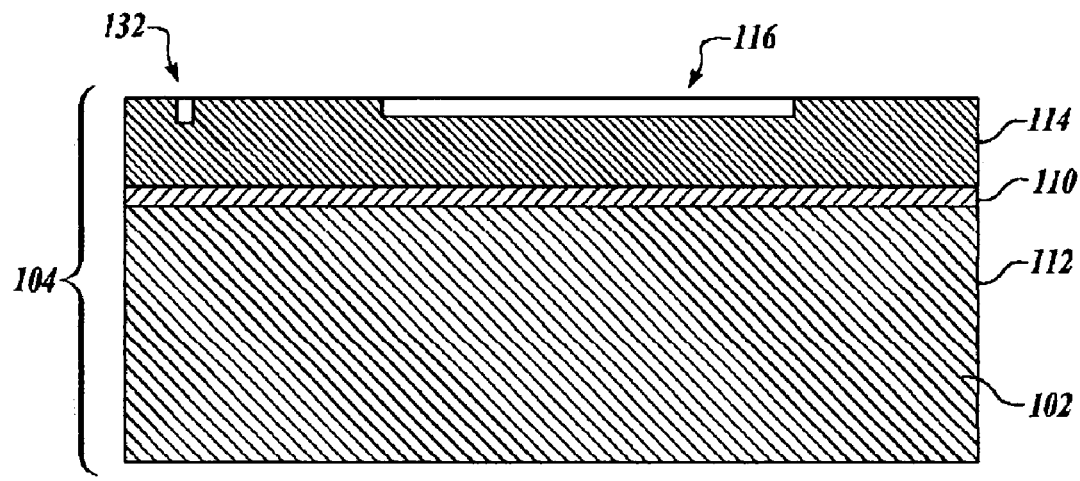
FIG. 9 is a cross-sectional view of a SOI base plate of the present invention and illustrates a capacitive air gap being formed in the active layer of the SOI base wafer element.

FIG. 9 is a cross-sectional view of the SOI base plate 102 and illustrates the alignment marks 132 created by photolithography and etching of SCS active layer 114. The alignment marks 132 are used for reference alignments on active layer 114, and for later alignment of the SOI resonator wafer 108. A capacitive air gap 116 is also formed in the active layer 114 of the SOI base wafer 104. This forming the capacitive air gap 116 in the active layer 114 is in direct contrast to prior art clamped-clamped, clamped-free, and free-free beam high frequency devices wherein the transducer capacitor gap spacing was determined by removal of a thin sacrificial layer. The active layer 114 is machined using, by example and without limitation, conventional photolithography masking and wet etching technology. Alternatively, the active layer 114 is machined using dry etching processes, such as either RIE (Reactive Ion Etch) or DRIE (Deep Reactive Ion Etch) processes. Such processes include, for example, the deep trench dry silicon etching processes commercially known as "BOSCH" and "ALCATEL" RIE and DRIE processes both obtain substantially vertical sidewalls of the etched features without concern for the crystallographic orientation of the etched substrate, whereby a more compact MEMS device results, which in turn enables more devices to be fabricated per wafer to produce a significant cost advantage.

By example and without limitation, the active layer 114 is machined using a silicon nitride deposition over which a photolithographic pattern is formed using photoresist masking material, followed by etching of the silicon nitride and stripping of the photoresist to create a silicon nitride mask over the active layer 114 with trenches forming the mask pattern. Silicon oxide is grown via thermal oxidation in the trenches. A silicon oxide/silicon nitride etch is performed to create the air gap 116 as a recess of very precise depth in the base plate active layer 114. The precision of the recess that forms the air gap 116 is more precise than using photoresist as sacrificial material. As contrasted with prior art wet etching methods, the method of the present invention is able to provide precise and very small capacitor air gaps 116 because the spacing is controlled by oxidation only, rather than wet etching of a photoresist. The depth of the air gap 116 is a function of design and performance parameters that are particular to the application. Precisely recessed air gaps 116 in the order of few Angstroms can be achieved using this technique. According to one embodiment of the present invention, the thermal oxidation and subsequent etching is used to create a recess of about 300 Å in the base plate active layer 114.

Figure 10:
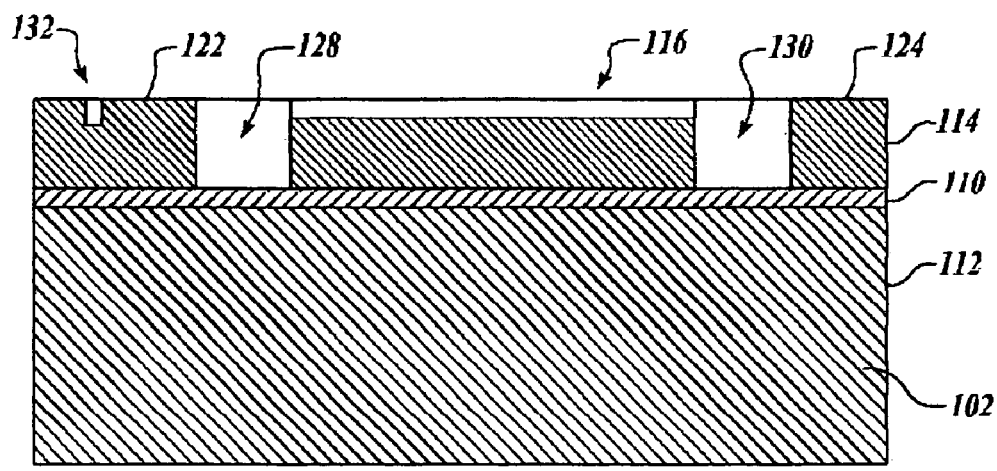
FIG. 10 is another cross-sectional view of the SOI base plate of the present invention and illustrates micromachining of the active layer of semiconductor material of the SOI base wafer element whereby mechanism features are formed.

FIG. 10 is another cross-sectional view of the SOI base plate 102 and illustrates micromachining of the active layer 114 of semiconductor material of the SOI base wafer element 104, whereby mechanism features are formed. For example, the resonator anchors 122, 124 are formed for supporting the resonator 106 relative to the air gap 116, and transmission lines 126 are also formed in a pattern structured to cooperate with the resonator 106. One or more isolation trenches 128, 130 are formed that reach to the buried dielectric layer 110 for electrically isolating the different anchors 122, 124 and RF transmission lines 126 of the mechanism features. The anchors 122, 124, transmission lines 126, and isolation trenches 128, 130 are formed by patterning of these features using photoresist mask material patterned by photolithography, which is followed by a silicon etch, such as RIE or DRIE, stopping at the buried oxide dielectric layer 110 in the SOI base wafer 104. The photoresist mask material is then removed and the resulting SOI base plate 102 is cleaned.

Figure 11:
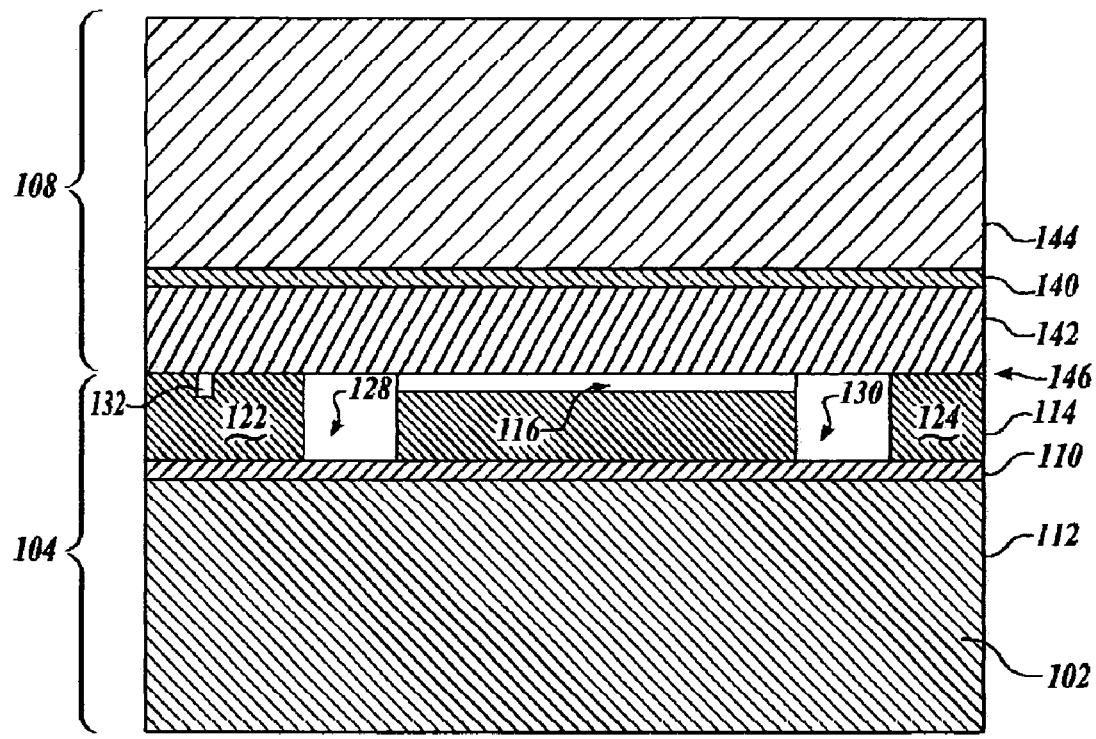
FIG. 11 is a side view of the SOI base plate of the present invention with a SOI resonator wafer element emplaced.

FIG. 11 is a side view of the SOI base wafer 104 fusion bonded with the SOI resonator wafer 108 and placed. The SOI resonator wafer element 108 includes a buried dielectric layer 140 having a thickness of from about 0.4 or thinner to about 2.0 microns that is sandwiched between relatively thicker "active" and "handle" layers 142, 144 both of semiconductor material.

In an as yet unpatterned state, the SOI resonator wafer 108 is flipped vertically and, having the active layer 142 facing the active layer 114 of the SOI base wafer 104 having the resonator anchor features 122, 124 separated by the capacitive air gap feature 116, the RF transmission line features 126, isolation trench features 128, 130 and alignment marks feature 132. The unpatterned and flipped SOI resonator wafer 108 is flat aligned with the SOI base wafer 104 using major or minor flats of both wafers. The SOI resonator wafer 108 requires flat alignment only because it is as yet unpatterned so that the precision alignment required of prior art methods is not necessary.

Figure 12:
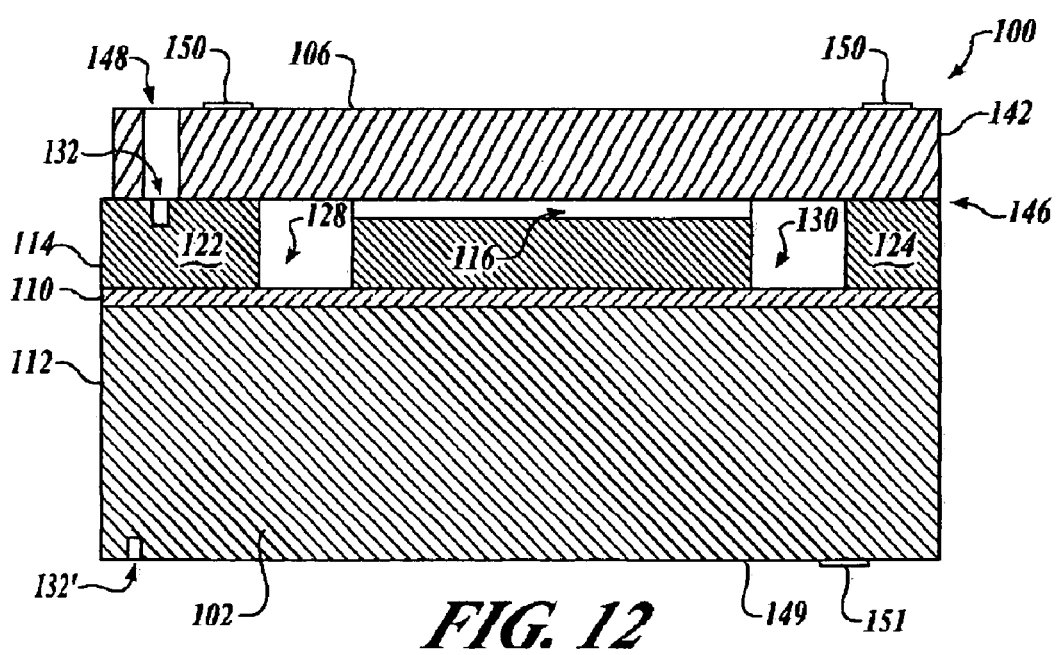
FIG. 12 is a cross-sectional view of the micromechanical resonator device of the present invention having the SOI resonator wafer element being machined to develop the micromechanical silicon resonator and supplemental operational features as may be required.

FIG. 12 is a cross-sectional view of the micromechanical resonator device 100 of the present invention having the SOI resonator wafer 108 micromachined to develop the micromechanical silicon resonator 106 and supplemental operational features as may be required. The handle layer 144 and internal oxide dielectric layer 140 are stripped from the active layer 142 of the SOI resonator wafer element 108. According to one embodiment of the invention, using photolithography and silicon etching, one or more windows 148 are etched to open access to alignment marks 132 on active layer 114 of base wafer 104. The windows 148 are larger than the alignment marks 132 and in alignment therewith. The alignment marks 132 are used for subsequent photolithography alignment steps for SOI resonator wafer active layer 142.

While alignment windows result in better alignment accuracy, alignment is optionally accomplish by another method. Alternatively, for example, alignment marks 132' are formed in the backside 149 of the SOI base plate 102 and used for front to back alignment.

Next steps include phosphorous doping of the active layer 142 at selected locations. This is followed by metal deposition of metal such as gold or aluminum on active layer 142 to create contact pads 150 for signal lines and at least one ground connection. Next steps include metal deposition on backside 149 of base wafer 104 to create a gold or aluminum ground contact pad 151 for grounding of the SOI base plate 102. Contact pad 151 on backside of base wafer 104 is optionally provided by a conventional blanket metal deposition step. In practice, the ground contact pad 151 and the ground line of contact pads 150 are connected to prevent floating grounds.

Using the viewing windows 148 to align relative to the alignment marks 132 on the SOI resonator wafer element 108, or another alignment method, the active layer 142 is patterned with photoresist masking material by photolithography. Accordingly, the requirement in prior art methods for a precise fusion bond alignment is eliminated. The active layer 142 is silicon dry etched using either RIE or DRIE machining to define the single crystal silicon resonator 106 in the active layer 142. Thus, in contrast to prior art methods of releasing the resonator, the present invention does not require a wet etch release because a sacrificial layer is not being removed to release the silicon resonator 106 of the invention. The photoresist masking material is dry stripped, whereupon the micromechanical resonator device 100 is free.

When joined by fusion or direct bonding, the interface 146 couples the single crystal silicon resonator 106 to the single crystal silicon anchor features 122, 124 of the SOI base plate 102. Thus, according to any embodiment of the invention, the resonator 106 is formed of single crystal silicon. Accordingly, several advantages over the prior art are realized by the invention. The device resonator 106 is a single crystal silicon. As contrasted with the polysilicon resonators of the prior art, the single crystal resonator 106 results in higher Q and has none of the impurities present in polycrystalline silicon or "polysilicon" thin films or other material thin films to degrade device performance. The use of single crystal silicon for the resonator 106 also eliminates both the intrinsic stresses and the stress gradients that effect performance of prior art devices based upon polycrystalline silicon resonators, which is a critical attribute for devices used in applications that require high repeatability and reproducibility. The dry etch release of the resonator 106 and complementary dry stripping of the photoresist masking material eliminate the prior art methods of sacrificial surface wet etch micromachining that complicate the prior art manufacturing process and generally results in low yield because of the difficulty in removing the sacrificial material in the small gap between the resonator and the lower electrode and results in stiction or adhesion, which further lowers yields. Rather, in contrast to the prior art methods, forming the capacitive air gap 116 in the active layer 114 of the base wafer 104 results in precise depth control and very small capacitor air gaps 116. Micromachining of the resonator 106 with the active layer 142 of the flipped SOI resonator wafer 108 in place on the base plate 102 eliminates the precise fusion bond alignment necessary, and replaces it with the simpler flat alignment only visually through the viewing windows 148.

According to embodiments of the invention wherein the base wafer 104 is a single crystal silicon SOI wafer, which results in single crystal silicon anchors 122, 124 that are more rigid than anchors known in the prior art. When joined by fusion bonding, the interface 146 couples the resonator 106 into a single crystal silicon with the anchor features 122, 124 of the SOI base plate 102. Thus, according to this fusion bonded embodiment of the invention, the resonator 106 and anchors 122, 124 are joined in an integrated unit formed of uniform single crystal silicon. Accordingly, additional advantages over the prior art are realized by this fusion bonded embodiment of the invention. The device resonator 106 is integral with the supporting anchors 122, 124 so that the interface stresses of the prior art devices arising from material and thermal expansion coefficient differences are eliminated. Thus, as contrasted with the polysilicon resonator beams of the prior art, the integral single crystal resonator 106 and supporting anchors 122, 124 of the present invention eliminates the thermal gradients and intrinsic stresses at the interface of the polycrystalline silicon resonator and the underlying silicon support anchors that occur in prior art devices and degrade device performance.

Figure 13:
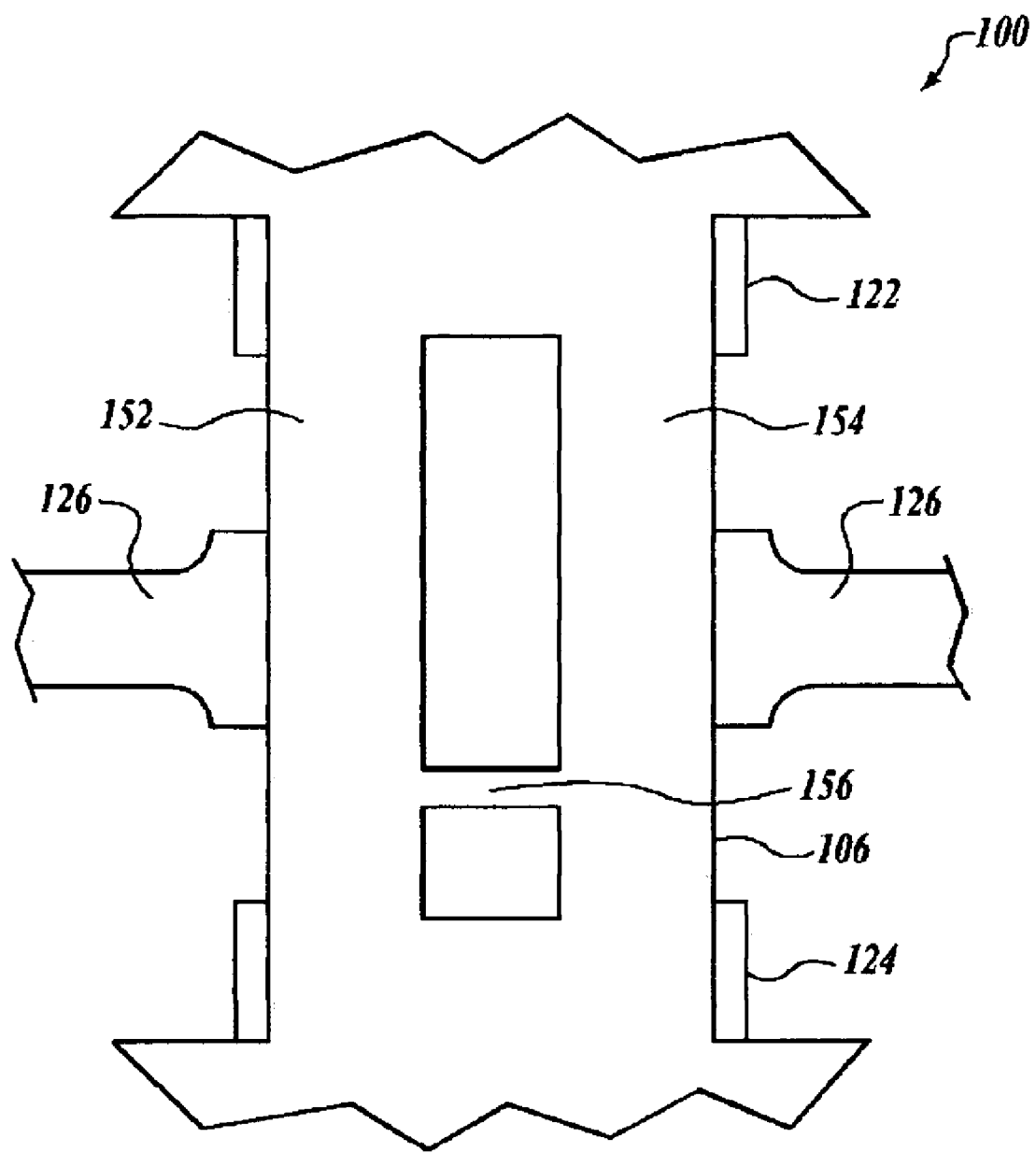
FIG. 13 is a plan view of a portion of one device of the present invention having a single crystal silicon resonator embodied as a clamped-clamped dual beam resonator having first and second single crystal silicon resonator beams connected with a coupling beam to form a filter device.

FIG. 13 is a plan view of a portion of one exemplary device 100 of the present invention having a single crystal silicon resonator 106 embodied as a clamped-clamped dual beam resonator having first and second single crystal silicon resonator beams 152, 154 connected with a coupling beam 156 to form a filter device. According to the method of the present invention, the first and second resonator beams 152, 154 are coupled to the single crystal silicon support anchors 122, 124 of the SOI base plate 102 by either fusion, anodic or eutectic bonding, whereby the device 100 is able to simultaneously achieve high-Q and high stiffness, which is paramount for communications-grade resonators.

Alternatively, the single crystal silicon resonator 106 is embodied as a single crystal silicon clamped-free resonator beam, a free-free resonator beam, or a single crystal silicon membrane or disk.

According to one embodiment of the present invention, the clamped-clamped resonator 106 is an interconnected dual resonator that is structured for operation as a filter device.

According to a different embodiment of the present invention, the single crystal silicon wafer mechanical resonator 106 is structured as a clamped-free interconnected dual beam resonator that is structured for operation as a filter device.

Alternatively, the single crystal silicon wafer mechanical resonator 106 is structured as a free-free interconnected dual beam resonator that is structured for operation as a filter device.

Alternatively, the single crystal silicon wafer mechanical resonator 106 is structured as a single disk or multidisk interconnected resonator that is structured for operation as a filter device.

According to different embodiments of the present invention, the active layer 142 of the SOI resonator wafer 108 is fusion bonded to the active layer 114 of the SOI base wafer element 104 into a single substrate that is micromachined to produce the resonator 106, by example and without limitation the first and second single crystal silicon resonator beams 152, 154, which are integral with the single crystal silicon support anchors 122, 124 of the SOI base plate 102. The resulting device 100 provides all the advantages over the prior art of a single crystal silicon resonator, and also provides the added advantages inherent in forming the resonator beams 152, 154 and support anchors 122, 124 of a single integrated substrate.

According to different embodiments of the present invention, the base wafer 104 is an insulating wafer-type substrate, wherein the air gap 116 and alignment marks 132, 132' are etched via bulk micro aching using wet and/or dry etching techniques in the insulating substrate. Transmission lines are formed using metal deposition in etched cavities on the substrate, for example, via E-beam metal deposition or sputtering. The glass or insulating wafer-type substrate is optionally bonded to the beam SOI wafer 108 using anodic or frit bonding. Such embodiments also result in the resonator 106 being of single crystal silicon, whereby the advantages discussed herein are realized.

Figure 14:
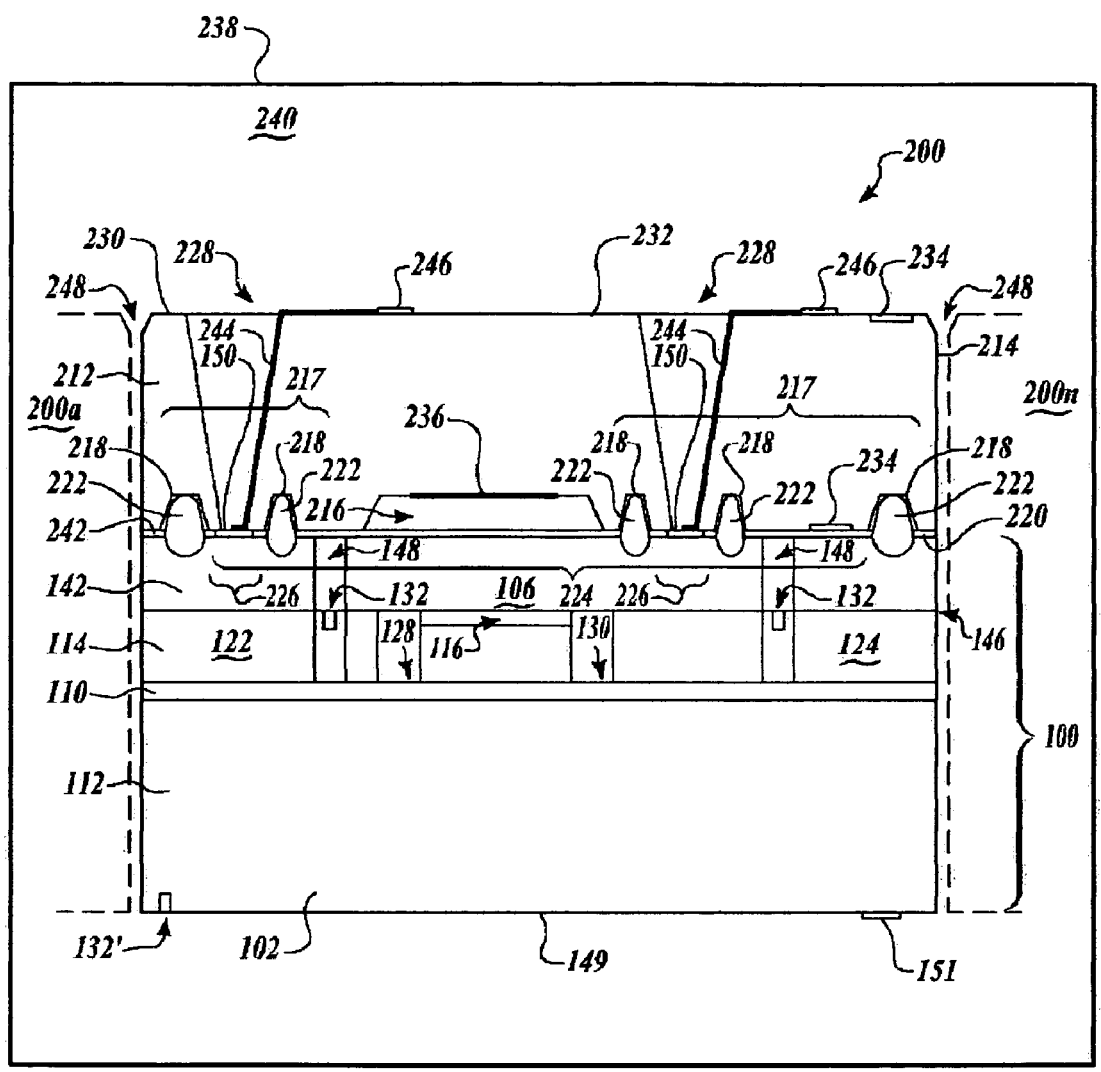
FIG. 14 illustrates vacuum packaging of micromechanical resonator device of the present invention.

FIG. 14 illustrates vacuum packaging of micromechanical resonator device 100 of the present invention whereby the packaging operation is accomplished on the chip via wafer level processing, which results in lower fabrication costs and improved performance over prior art devices. Accordingly, the present invention provides a hermetically sealed vacuum packaged micromechanical resonator device 200 including the micromechanical resonator device 100 of the present invention formed of single crystal silicon (SCS) and sealed with a cover 212 also formed of single crystal silicon to protect the micromechanical resonator 106.

In a cover wafer element 214 of single crystal silicon (SCS) semiconductor material, or other materials including but not limited to polycrystalline silicon, glasses, including low expansion borosilicate glass, and quartz, a trench 216 is etched as a recess for clearance of the resonator 106 of resonator device 100. Optionally, one or more additional trenches 218 are etched in a bottom surface 220 the cover wafer element 214 for later screen printing of frit 222 for bonding to the active layer 142 of the device SOI resonator wafer element 108. The frit trenches 218 are provided in a bonding pattern 217 that is configured to surround and isolate an interior area 224 of the wafer bottom surface 220 corresponding to the resonator 106. The bonding pattern 217 of optional frit trenches 218 is also configured to surround areas 226 of the wafer bottom surface 220 corresponding to the contact pads 150 to isolate the contact pads 150 after sealing. Alternatively, bonding to the active layer 142 is accomplished by any conventional bonding method, including but not limited to direct or fusion bonding and low temperature bonding processes of the same, anodic and eutectic bonding, whereby the frit trenches 218 and screen printed frit 222 are eliminated. Different bonding methods are appropriate when the cover wafer element 214 is formed of different materials. Fusion or direct bonding requires surfaces to be single crystal silicon; any oxide, nitride or particulate will prevent fusion bonding. Anodic bonding is appropriate between silicon and low expansion borosilicate glass, such as Pyrex®. Eutectic and frit bonding can be practiced between any two surfaces without constraints such as SCS, silicon or glass.

The resonator clearance trench 216 and optional frit trenches 218, when present, are etched using one of the commercially known silicon etching processes discussed herein, such as RIE or DRIE, or one of the conventional wet etching techniques, such as anisotropically etching in a suitable etchant, such as potassium hydroxide (KOH).

Access holes 228 are anisotropically etched through the cover wafer element 214 in a pattern that is configured to expose the contact pads 150 on the active layer 142. Alternatively access holes 228 are etched using one of the commercially known silicon etching processes such as RIE or DRIE. Access holes 228 are sized to be smaller than the area of the corresponding contact pads 150 on the device active layer 142 such that the access holes 228 are sealed by the contact pads 150 upon mating the cover 212 with the device active layer 142. Access holes 228 are typically smaller than contact pads to allow hermetic sealing and to provide a well isolated electrical connection.

After fabrication of access holes 228, the cover wafer element 214 is oxidized to form a oxidation layer 230 on the cover wafer bottom surface 220 and an opposing top surface 232 for electrical isolation of the cover 212. Ground contacts 234 are then etched through the oxidation layer 230 on the opposing top and bottom surfaces 232, 220 of the cover wafer 214 to form electrically conductive paths for grounding the cover 212.

In an alternative embodiment having the cover 212 formed in a cover wafer element 214 of insulating substrate material, such as glass and quartz, the oxidation layer 230 on the opposing top and bottom surfaces 232, 220 of the cover wafer 214 is eliminated.

Now being ready for installation, bottom surface 220 of the cover 212 is screen printed with the bonding frit material 222 in the pattern of frit trenches 218 previously etched in a configuration determined to cooperate with the active layer 142 for sealing the micromechanical resonator 106 and isolating the contact pads 150 after sealing. Else, the bonding pattern 217 is prepared in the bottom surface 220 the cover wafer element 214 for another conventional bonding method, including but not limited to direct or fusion bonding and low temperature bonding processes of the same, anodic and eutectic bonding. The bonding pattern 217 is prepared in a configuration that surrounds and isolates the interior area 224 of the wafer bottom surface 220 corresponding to the resonator 106. The bonding pattern 217 also surrounds the areas 226 of the wafer bottom surface 220 corresponding to the contact pads 150 to isolate the contact pads 150 after sealing. A film of "getter" metal 236 is deposited nearby the SCS micromechanical resonator 106 formed in the active layer 142 of the device SOI resonator wafer element 108. The getter metal 236 is a metal or metal alloy that can absorb gases or particulates that are released during the subsequent bonding process during fabrication or during device operation. In this example, the getter metal 236 is deposited in the clearance recess 216.

In a chamber 238, such as a glove box or bonding chamber, enclosing a vacuum or another controlled atmosphere 240, the device 100 of the invention is sealed by frit bonding the cover 212 with the device SOI resonator wafer element 108, which protects the micromechanical resonator 106 formed in the active layer 142. Else, as discussed above, bonding the cover 212 to the active layer 142 is alternatively accomplished at least in the bonding pattern 217 according to any conventional bonding method, including but not limited to direct or fusion bonding and low temperature bonding processes of the same, anodic and eutectic bonding. Sealing in the vacuum chamber 238 ensures that an appropriately high vacuum is sealed within the etched cavities, including the capacitive air gap 116, isolation trenches 128, 130 alignment marks 132, windows 148, getter trench 216, and any volume of the frit trenches 218, when present, unfilled by the frit 222.

The contact pads 150 on the top surface 242 of the device active layer 142 are exposed through alignment with the access holes 228. Metal, such as gold or aluminum, is deposited through an aperture mask or a stencil type mask by a conventional metal deposition process to form electrically conductive paths or metal traces 244 through the access holes 228 between the device contact pads 150 and contact pads 246 formed on the top surface 232 of the cover 212. The traces 244 and contact pads 246 make electrical contact with electrodes, RF lines, and ground path of the device 100 through the device contact pads 150.

The base and resonator wafers 104, 108 joined with the cover wafer 214 are diced along dicing streets 248 to separate the hermetically sealed packaged micromechanical SCS resonator device 200 from other similarly hermetically sealed packaged devices 200a-200n (shown in phantom). The present invention thus provides a packaged device 200 formed of single crystal silicon (SCS) semiconductor material that is unknown in the prior art.

In an alternative embodiment wherein the cover wafer element 214 is formed of a material other than single crystal silicon (SCS) semiconductor material, such as but not limited to glass, borosilicate, and quartz, the cover 212 is optionally sealed to the active layer 142 of the device 100 in the bonding pattern 217 according to any conventional bonding method, including but not limited to anodic and eutectic bonding.

Figure 15:
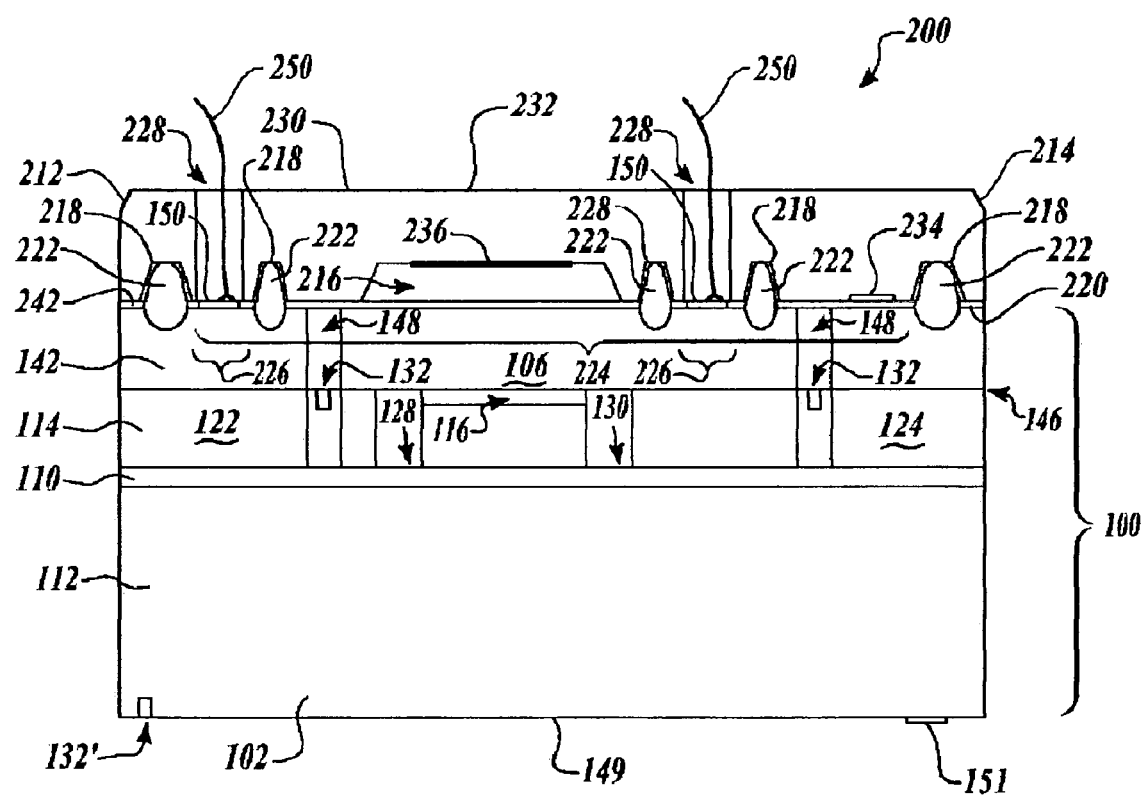
FIG. 15 illustrates an alternative embodiment of the vacuum packaging of micromechanical resonator device of the present invention illustrated in FIG. 14.

FIG. 15 illustrates the hermetically sealed vacuum packaged micromechanical resonator device 200 of the invention including the micromechanical resonator device 100 of the invention formed of single crystal silicon (SCS) and sealed with a cover 212 also formed of single crystal silicon to protect the micromechanical resonator 106. Here, cover wafer 212 is thinned either before or after bonding by removing material of one or both of the top and bottom surfaces 232, 220 using any convenient method, including but not limited to grinding, sandblasting, wet etching or dry etching, to reduce the thickness of cover wafer 212 such that any standard wire bonding station may be used to directly make wire bonding connections 250 through the access hole 228 to the electrical contact 150 of the device 100 of the invention. Accordingly, the traces 244 and associated contact pads 246 are eliminated from the cover 212.

Furthermore, the access holes 228 are optionally formed any convenient micromachining method, including but not limited to drilling, dicing, sandblasting, dry or wet etching.

While the preferred embodiment of the invention has been illustrated and described, it will be appreciated that various changes can be made therein without departing from the spirit and scope of the invention.

What is claimed is:

1. A method for forming a hermetically sealed vibrating micromechanical structure, the method comprising:

micromachining one or more resonator structure anchors, a capacitive air gap, one or more isolation trenches, and one or more alignment marks in a single crystal silicon semiconductor material active layer of a first Silicon-On-Insulator wafer having a dielectric layer between a semiconductor material handle layer and the semiconductor material active layer;

fusion bonding a single crystal silicon semiconductor material active layer of a second Silicon-On-Insulator wafer directly to the active layer of the first Silicon-On-Insulator wafer, the second Silicon-On-Insulator wafer having a dielectric oxide layer between a semiconductor material handle layer and the semiconductor material active layer;

removing the handle and dielectric oxide layers of the second Silicon-On-Insulator wafer;

etching one or more windows in the active layer of the second Silicon-On-Insulator wafer;

silicon dry etch micromachining a single crystal silicon resonator structure in the single crystal silicon semiconductor material active layer of the second Silicon-On-Insulator wafer;

forming one or more contact pads on the active layer of the second Silicon-On-Insulator wafer;

forming a cover in a cover wafer having spaced apart top and bottom surfaces, forming the cover further comprising micromachining a plurality of access holes through the wafer between the spaced apart top and bottom surfaces with each of the access holes being positioned to align with a corresponding one of the contact pads formed on an outer surface of the active layer of the second Silicon-On-Insulator wafer; and in a controlled atmosphere, bonding a cover to the active layer of the second Silicon-On-Insulator wafer over the resonator structure with the access holes aligned with the respective corresponding contact pad.

2. The method of claim 1, further comprising forming the cover in a cover wafer formed of a semiconductor material, comprising: polycrystalline silicon semiconductor material, and single crystal silicon semiconductor material.

3. The method of claim 2 wherein forming the cover further comprises:

micromachining a pattern of frit trenches in the wafer bottom surface, the pattern of frit trenches surrounding each of the access holes and surrounding an interior area of the wafer bottom surface corresponding to the resonator structure; and further comprising screen printing of frit bonding material in the frit trenches; and wherein bonding a cover to the active layer of the second Silicon-On-Insulator wafer over the resonator structure further comprises bonding of the cover by frit bonding the cover to the outer surface of the second resonator wafer active layer with the frit bonding material in the frit trenches surrounding the access holes being aligned with the respective contact pads and the frit bonding material in the frit trenches surrounding the interior area of the wafer bottom surface being aligned with the resonator structure.

4. The method of claim 3, further comprising etching a clearance recess corresponding to the device resonator.

5. The method of claim 1, further comprising: either before or after bonding cover to the active layer of the second Silicon-On-Insulator wafer, thinning the cover wafer by removing material of at least one of the top and bottom surfaces.

6. The method of claim 1, further comprising depositing an electrically conductive metal trace in each of the access holes between the corresponding contact pad and a contact pad formed on the top surface of the cover.

7. The method of claim 1 wherein the cover is further formed in a cover wafer formed of an insulating substrate material; and wherein bonding a cover to the active layer of the second Silicon-On-Insulator wafer over the resonator structure further comprises bonding at least a portion of the wafer bottom surface of the cover to the outer surface of the second resonator wafer active layer in a bonding pattern in areas of the wafer bottom surface surrounding each of the access holes and surrounding an interior area of the wafer bottom surface substantially corresponding to the resonator structure, with the bonding pattern in the areas aligned with the respective contact pads and the bonding pattern surrounding the interior area aligned with the resonator structure.

8. The method of claim 1 wherein forming the cover further comprises thinning the cover wafer; and further comprising wire bonding electrical connections to the contact pads on the outer surface of the resonator wafer active layer.

9. The method of claim 1, wherein machining at least the capacitive air gap comprises:

using a silicon nitride deposition over which a photolithographic pattern is formed using a photoresist masking material;

etching the silicon nitride;

stripping the photoresist masking material to create a silicon nitride mask over the active layer with a plurality of trenches forming the mask pattern;

performing a thermal oxidation to grow silicon oxide in the trenches; and performing a silicon oxide/silicon nitride etch to create the capacitive air gap as a recess of very precise depth.

* * * * *